United States Patent [19]

Erbil

[11] Patent Number: 4,882,206

[45] Date of Patent: Nov. 21, 1989

[54] CHEMICAL VAPOR DEPOSITION OF GROUP IIIB METALS

[75] Inventor: Ahmet Erbil, Atlanta, Ga.

[73] Assignee: Georgia Tech Research Corporation, Atlanta, Ga.

[21] Appl. No.: 210,020

[22] Filed: Jun. 22, 1988

[51] Int. Cl.$^4$ .............................................. B05D 3/02
[52] U.S. Cl. .................................. 427/229; 427/252; 427/255.1; 427/255.2; 427/255.3
[58] Field of Search ............... 427/226, 229, 255, 252, 427/255.1, 255.2, 255.3, 343, 314, 316, 318, 319, 376.1, 376.4, 383.1, 383.3, 383.5, 383.7

[56] References Cited

U.S. PATENT DOCUMENTS

| | | | |
|---|---|---|---|
| 3,018,194 | 1/1962 | Norman et al. | 427/252 |
| 3,071,493 | 1/1963 | Whaley. | |
| 3,253,946 | 5/1966 | Kozikowski et al. | 427/252 |
| 3,856,580 | 12/1974 | Smeggil et al. | 427/252 |
| 3,856,581 | 12/1974 | Smeggil et al. | 427/252 |
| 3,856,582 | 12/1974 | Smeggil et al. | 427/252 |
| 4,510,182 | 4/1985 | Cornils et al. | 427/255.2 |

OTHER PUBLICATIONS

Devyathykh, G. G. et al, Zhurnal Neorganicheskoi Khimii, vol. 25, pp. 2109–2112 (1980) English Translation).

Primary Examiner—Stanley Silverman
Attorney, Agent, or Firm—Oldham & Oldham Co.

[57] ABSTRACT

Coatings of Group IIIB metals and compounds thereof are formed by chemical vapor deposition, in which a heat decomposable organometallic compound of the formula (I)

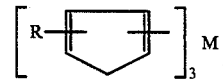

where M is a Group IIIB metal, such as lanthanum or yttrium and R is a lower alkyl or alkenyl radical containing from 2 to about 6 carbon atoms, with a heated substrate which is above the decomposition temperature of the organometallic compound. The pure metal is obtained when the compound of the formula I is the sole heat decomposable compound present and deposition is carried out under nonoxidizing conditions. Intermetallic compounds such as lanthanum telluride can be deposited from a lanthanum compound of formula I and a heat decomposable tellurium compound under nonoxidizing conditions.

14 Claims, No Drawings

CHEMICAL VAPOR DEPOSITION OF GROUP IIIB METALS

This invention was made with United States Government support under Grant #DE-FG05-86ER45266, awarded by the Department of Energy. The Government has certain rights in this invention.

TECHNICAL FIELD

This invention relates to processes for forming a thin metallic coating on a heated substrate by decomposition of a thermally decomposable organometallic compound, and to thermally decomposable organometallic compounds used in such processes.

BACKGROUND ART

Chemical vapor deposition has been extensively described in the literature (including patents) as a technique for depositing a thin metallic coating on a heated substrate. Basically, a heat decomposable volatile metal compound (usually on organometallic compound), which may be called the precursor, is contacted with a substrate which has been heated to a temperature above the decomposition temperature of the metal compound. The metallic coating may be a metal, metal mixture or alloy, or metal compound or mixture thereof, depending on the choice of precursor(s) and reaction conditions.

While the technique has been described with reference to most transition metals and to certain other metals and metalloids (silicon, for example), commercial use of CVD for the most part has been confined to deposition of a few metals and metal compounds, such as silicon, tungsten, and certain III-V and II-VI compounds (denoting, respectively, a compound of a Group III metal and a Group V element, and a compound of a Group II metal and a Group VI element). The absence of suitable heat decomposable organometallic compounds for elements other than those mentioned above appears to have limited the extension of CVD to the deposition of other metals or compounds.

DISCLOSURE OF THE INVENTION

According to this invention, a metallic coating is formed on a heated substrate by contacting a heat decomposable organometallic compound having the formula (I)

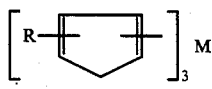

where M is a metal of Group IIIB of the Periodic Table, or a mixture thereof, and R is a lower alkyl or alkenyl radical containing from 2 to about 6 carbon atoms, with the substrate, which is at a temperature above the decomposition temperature of the organometallic compound.

The terms, "metal of Group IIIB of the Periodic Table" and "Group IIIB metal" herein, refer to the Periodic Table as shown on page 789 of "The Condensed Chemical Dictionary; 10th edition, 1981, by G. G. Hawley, published by Van Nostrand Reinhold Company, N.Y., and include the lanthanide and actinide series metals.

M is preferably lanthanum or yttrium. R is preferably lower alkyl, especially a lower alkyl radical containing from 2 to 4 carbon atoms.

The metallic coating may contain one or more metals, or one or more metal compounds. At least one constituent of the coating (where more than one chemical species is present) is a Group IIIB metal or metal compound. A coating of essentially pure metal M is obtained when a single organometallic compound or precursor as above defined is the sole reactant and is contacted with the substrate under nonoxidizing and preferably reducing conditions. Additional reactants are required when a coating contains more than one metal. This will be discussed subsequently in further detail.

BEST MODE FOR CARRYING OUT THE INVENTION

The heat decomposable organometallic compounds which are used as precursors in the practice of this invention meet the following requirements: (1) they are liquids at 100° C., (i.e. the melting points are below 100° C.); (2) they have vapor pressures of at least 0.1 torr at 100° C.; (3) they clearly decompose to deposit metal with little or no carbon incorporation (i.e., not more than about 5 percent by weight of carbon in the metal); (4) they are thermally stable at temperatures below about 150° C.; and (5) they thermally decompose with the deposition of metal at a temperature from about 150° to about 1000° C.

The low melting points and the large temperature difference between the melting point and the decomposition temperature of precursor compounds used herein make it possible to disperse the liquid precursors into a carrier gas stream at convenient operating temperatures without risk of premature decomposition. High vapor pressure at 100° C., assures a sufficiently high concentration of precursor in carrier gas for effective metal oxide deposition. The thermal decomposition temperatures of the precursors are low enough for economical operation, with few if any requirements for special high temperature resistant equipment in most cases. Finally, precursors herein give highly pure deposits under suitable deposition conditions.

The precursors used herein meet the above requirements and generally have lower melting points and higher vapor pressures at 100° C., and usually have greater temperature differences between the melting point and the decomposition temperature than their cyclopentadienyl metal analogs in which the cyclopentadienyl radical is unsubstituted.

Precursors for depositing Group IIIB in metals in accordance with this invention are compounds of formula (I) as aforedescribed.

The metal M in formula (I) may be, for example, scandium, yttrium, lanthanum, cerium, praseodymium, neodymium, samarium, europium, gadolinium, terbium, dysprosium, holmium, erbium, thulium, ytterbium, lutecium, thorium, uranium or plutonium.

The aliphatic substituent R on the cyclopentadienyl ring contains from 2 to about 6 carbon atoms, preferably 2 to about 4 carbon atoms, and may be either alkyl or alkenyl. Suitable alkyl substituents include ethyl, propyl, isopropyl, butyl, isobutyl, sec-butyl, pentyl and hexyl. Suitable alkenyl substituents include vinyl, allyl, isopropenyl, 1-butenyl, 2-butenyl and 3-butenyl. The alkyl substituents are preferred. The alkyl or alkenyl substituent R imparts higher volatility, so that the organometallic compounds of this invention have lower boiling points and higher vapor pressures at 100° C. than do the analogous unsubstituted cyclopentadienyl compounds (those of the formula I above except that $R_1$ is hydrogen).

Representative organometallic precursor compounds of formula (I) which are suitable for deposition of a Group IIIB metal or compound thereof include the following:
tris(isopropylcyclopentadienyl) scandium,
tris(isopropylcyclopentadienyl) yttrium,
tris(isopropylcyclopentadienyl) lanthanum,
tris(isopropylcyclopentadienyl) cerium,
tris(isopropylcyclopentadienyl) praseodymium,
tris(isopropylcyclopentadienyl) neodymium,
tris(isopropylcyclopentadienyl) gadolinium,
tris(ethylcyclopentadienyl) lanthanum,
tris(butylcyclopentadienyl) lanthanum, and
tris(tert.-butylcyclopentadienyl) lanthanum.
Tris(isopropylcyclopentadienyl) compounds of Group IIIB metals not specifically names are also suitable. Ethyl, propyl, butyl, isobutyl, sec.-butyl, tert.-butyl, pentyl (all isomers) and hexyl (all isomers) homologs of the above compounds are also suitable.

General Method For Preparing Precursors

Organometallic precursor compounds of Formula (I) can be prepared by the general method described below. This method proceeds according to the following equations (1) through (3) (1) $C_5H_6 + Na \rightarrow NaC_5H_5 + \frac{1}{2} H_2$ (2) $NaC_5H_5 + RBr \rightarrow RC_5H_5 + NaBr$ (3) $RC_5H_5 + Na \rightarrow RC_5H_4Na + \frac{1}{2} H_2$ (4) $3 R_5H_4Na + MCl_3 \rightarrow (RC_5H_4)_3M + 3 NaCl$ Sodium cyclopentadienide may be prepared according to equation (1) by reacting monomeric 1,3-cyclopentadiene in an inert solvent such as tetrahydrofuran (THF) with an excess of metallic sodium. The resulting solution of sodium cyclopentadienide (in THF) may be reacted in another vessel (away from excess sodium) with a lower alkyl or alkenyl bromide (e.g., isopropyl bromide or allyl bromide) according to equation (2) by adding the alkyl bromide through a dropping funnel. The resulting sodium bromide is allowed to settle. The alkylcyclopentadiene in solution produced may be separated from the sodium bromide and the solvent (e.g. THF) by fractional distillation. Equation (4) is then reacted with a further quantity of metallic sodium (e.g., as fresh sodium beads) according to equation (3). This reaction may be carried out at a slightly elevated temperature (e.g., 40° C. overnight). The resulting solution of sodium isopropylcyclopentadienide is reacted with a Group IIIB metal halide, such as lanthanum trichloride (preferably in excess), producing a tris(alkylcyclopentadienyl) metal compound, such as tris(isopropylcyclopentadienyl) lanthanum, which may be represented by formula (I). The entire series of reactions is carried out in the absence of air, e.g., under vacuum or in an argon atmosphere.

Deposition of Thin Coatings

It is possible to prepare thin coatings of alloys, mixtures and compounds of Group IIIB metals according to this invention. In fact, compounds are generally of greater interest than the free metals.

Mixtures of Group IIIB metals (e.g., a mixture of yttrium and lanthanum) can be deposited from a mixture of precursors of formula (I), in which each precursor is a compound of one of the metals.

Intermetallic compounds can also be deposited according to this invention. For example, lanthanum telluride can be deposited by using as precursors a lanthanum compound of formula (I), such as tris(isopropylcyclopentadienyl) lanthanum, and a heat decomposable organometallic tellurium compound, preferably one which meets the general requirements for precursors listed above. (The term "organometallic", as used herein is in accordance with the definition in "The Condensed Chemical Dictionary", 10th edition, page 762). A Representative tellurium precursor is diethyltelluride. Other intermetallic compounds, i.e. binary compounds of a Group IIIB with another metal or metalloid, can be prepared similarly by choosing heat decomposable organic compounds of the desired elements as precursors. The phosphides, arsenides and antimonides of yttrium and lanthanum are examples of such compounds. Precursors are one or more Group IIIB compounds of formula (I) and heat decomposable organometallic compounds of the desired metals and metalloids other than those of Group IIIB. The term, "metalloid" is used to denote the nonmetallic elements arsenic, antimony, boron, germanium, phosphorus, selenium, silicon and tellurium. Deposition is under nonoxidizing conditions, preferably under reducing conditions.

Group IIIB metal oxide coatings can be formed by using as precursor a compound of formula (I) which yields the desired metal on decomposition. The precursor is contacted with a heated substrate in the presense of an oxidizing agent, which is a mildly oxidizing gaseous oxygen source. The oxidizing agent may be any gaseous reactant which is capable of reacting with the organometallic precursor compound(s) at the decomposition temperatures of the latter to form metal oxide deposits. Oxygen compounds, such as nitrous oxide, carbon dioxide, THF (tetrahydrofuran) and steam, are better suited than oxygen or air to the deposition of metal oxides and oxygen-containing salts because the oxygen compounds react with organometallic compounds only at high temperatures. The oxidizing agent may be introduced into the reactor in admixture with a carrier gas. For example, when a yttrium oxide coating is desired, the precursor may be tris(isopropylocyclopentadienyl) yttrium or other yttrium compound of formula (I), and the oxidizing agents can be nitrous oxide/nitrogen and carbon dioxide/hydrogen mixtures.

The above method for preparing oxide coatings can be used with appropriate choice of precursors and oxidizing agent, to prepare other coatings containing a one or more Group IIIB metals, an oxidizing nonmetal (e.g., oxygen, sulfur or a halogen), and optionally one or more additional metals or metalloids (i.e., those not in Group IIIB). Examples of such coatings include lanthanum trifluoride, lead, lanthanum, zirconate, etc. In general these are salts of Group IIIB metals. Appropriate precursors are one or more Group IIIB metal compounds of formula (I) and one or more organometallic compounds yielding the desired additional metals or metalloids. When the oxidizing nonmetal of the coating is other than oxygen (i.e., sulfur or a halogen), an appropriate oxidizing agent, e.g., sulfide, or a halogen (e.g., chlorine), or a hydrogen halide (e.g., HCl) is chosen.

The substrate can be any material, usually either metallic or ceramic, on which an adherent metallic coating can be formed and which can be heated to a temperature above the decomposition temperatures of the precursor compounds. Thus, the substrate, can be a ceramic material such as glass or quartz, or a metal such as iron, nickel, titanium, tungsten, copper or aluminum. The substrate must be a solid at the decomposition temperature of the precursor. This poses no problems when the melting or softening point of the substrate is above 1000° C. When the desired substrate has a melting or softening point below about 1000° C. (which is the case with aluminum, certain other metals, and most glasses), one must use a precursor compound whose decomposition temperature is lower than the melting or softening point of the desired substrate.

The substrate can be of any desired shape, either regular or irregular. Thus, the substrate can be a rectangular solid or other solid characterized by flat exterior surfaces. Cylindrical surfaces, such as rods and wires, can also be coated according to this invention. Spherical surfaces and other curved surfaces can also be coated. The substrate can even be hollow, as for example, a tube or a hollow sphere having openings to the exterior.

Ductile metallic rods and wires are preferred substrates.

The desired metallic coating can be formed on the desired substrate by methods known in the art. "Metallic" in this connection includes pure metals, mixtures, alloys, and metal compounds (including intermetallic compounds, metal oxides and salts). Conventional chemical vapor deposition (CVD), chemical beam epitaxy (CBE) or metal-organic molecular beam epitaxy (MO-MBE) techniques, and variations thereof, can be used. Broadly, "chemical vapor deposition" or "CVD" includes any process in which a metallic coating is deposited on a heated substrate by decomposition of one or more precursor compounds. In conventional CVD the reactants are carried into the deposition region by carrier gas flow. Where, as here, a metallic coating is to be formed on a heated substrate, it is usually desirable to convey the organometallic precursor compound(s) and the oxidizing agent (where used) to the substrate in separate carrier gas streams in order to avoid premature reaction. In CBE or MO-MBE (these two terms are used synonymously herein), the reactants are introduced as separate streams into a high vacuum chamber and expanded to form molecular beams which are impinged line-of-sight on to a heated substrate. The molecular beams strike the hot substrate and deposit metals, which may be oxidized by an oxidizing gas stream to the corresponding oxides. Conventional CVD, CBE and MO-MBE techniques have been described in the literature, particularly the literature pertaining to deposition of silicon and III-V and II-VI compounds.

The foregoing processes can be carried out in any apparatus which includes a gas-tight chamber or gas space having means for supporting a substrate, means for heating this substrate to a temperature above the decomposition temperature of the decomposable metal compound, an inlet conduit for admitting gas or vapor streams of decomposable organometallic compound and oxidizing agent, and an outlet conduit for removing a stream of carrier gas, decomposition products and undecomposed metal compound from the chamber. Suitable apparatus of various types are well known in the art.

For CVD processes it is preferred to supply the organometallic compound(s), and the oxidizing agent where used, in streams of carrier gas. The preferred carrier gas for the organometallic compounds is hydrogen, argon, nitrogen, or a mixture of these. The desired mole fraction of each organometallic compound can be achieved by bubbling the carrier gas through a body or pool of the liquid organometallic compound at a rate and bubbler temperature (which is the same as the pool temperature) which will give the desired mole fraction. The bubbler temperature is typically from the melting point of the organometallic compound to about 150° C. The various organometallic compounds are preferably entrained in separate carrier gas streams, which after entrainment are combined into a single carrier gas stream, which is supplied to the reactor in which metal oxide deposition takes place. The mole ratios of the metals in the combined carrier gas stream is typically but not necessarily the same as the mole ratios of the metals in the metal oxide deposit, since metals do not always deposit in the same proportion as that in which they are present in the carrier gas. It is possible to supply the organometallic compounds in undiluted form at reduced pressure (say about 0.1 atmosphere or less) to the rector, but use of a carrier gas is generally preferred because it affords better process control. The oxidizing agent (e.g., nitrous oxide, carbon dioxide, THF or steam) is also preferably contained in a non-oxidizing carrier gas. For example, nitrous oxide may be diluted with nitrogen, and carbon dioxide and steam can be diluted with hydrogen. Separate streams of organometallic compounds and oxidizing agent are supplied to avoid premature decomposition of the organometallic compounds.

The substrate temperature for all processes according to this invention, whether CVD, MO-MBE (metalorganic molecular beam epitaxy) or CBE (chemical beam epitaxy) is above the decomposition temperature of the organometallic precursor compound, and is in the range of 150° C. to 1000° C. A preferred substrate temperature is in the range of 500°-600° C. regardless of which process is used.

CVD processes using a carrier gas are typically carried out in the pressure range of about 0.1 torr to about atmospheric pressure (760 torr), although higher or lower pressures can be used. MO-MBE or CBE process are typically carried out under high vacuum. For example, in preferred MO-MBE and CBE process, the reactor pressure is typically about $10^{-5}$ torr during crystal growth (i.e., while organometallic compounds are actually being supplied to the substrate), with a typical background pressure from $10^{-10}$ to $10^{-9}$ torr. The low background pressure in MO-MBE allows for fast switching of material composition, which is important in growing ultra thin layers and other multilayer coatings in which there are abrupt composition and sloping changes from layer to layer.

Decomposition products are removed from the reactor in all processes herein described via the outlet provided for that purpose.

Products of this invention may have any desired coating thickness ranging from monomolecular up to about one millimeter. A preferred range of thickness is from about 0.1 to about 100 microns, especially from about 0.1 to about 20 microns. Coating thickness can be controlled by controlling the flow rate of the organometallic compounds and the length of time over which these compounds are supplied. Products of this invention may be characterized as composite articles having a thin metallic coating thereon.

Single layer coatings, usually of substantially uniform composition throughout, can be achieved with any of the processes described herein. Multiple layer coatings having different compositions are best achieved with MO-MBE or CBE.

Epitaxial, polycrystalline and amorphous coatings can all be obtained in accordance with this invention.

Coatings produced according to this invention usually have a high degree of conformality. That is, the thickness of the coating is very nearly uniform even when the substrate has an irregular rough surface. This can be realized by depositing the coating in a surface kinetic limited regime (i.e., under conditions such that surface kinetics limit the deposition rate) at relatively low temperatures.

Processes of this invention offer a range of composite articles, comprising metallic coating or film on a substrate at low cost. High quality films of excellent purity are obtained. Low operating temperatures can be used, since in general the organometallic precursor compounds used herein have lower decomposition temperatures than their unsubstituted cyclopentadienyl metal analogs. Faster metal oxide deposition rates are made possible, particularly in CVD processes, by the relatively high vapor pressures of the organometallic precursor compounds used herein. The relatively wide "window" or temperature range between melting point and decomposition temperature makes the precursor compounds herein easy to handle.

Products of this invention may have a number of uses. For example, composite articles having a coating of a III-V material, such as lanthanum arsenide, may be useful in semiconductors. These may be deposited on conventional insulating substrates such as glass, plastic or printed circuit board. Desired patterns can be formed by conventional techniques. Other uses include ferroelectric devices, storage devices, dielectric amplifiers and digital calculators. Other uses include rectifiers, thin film resistors and capacitors, infrared windows and optical elements, ferroelectric materials, long wavelength optical fibers, magnetic thin films for optics and storage, solar cells, phosphors for television tubes, decorative coatings, and optical mirrors and coatings.

Preparation of precursors will be described further with reference to the specific preparation method which follow.

PREPARATION A

Tris(isopropylcyclopentadienyl)lanthanum:

Sodium cyclopentadienide is prepared by using 30 g of fine sodium beads (a two fold excess) and 50 ml of monomeric cyclopentadiene in 500 m of tetrahydrofuran (THF). This solution is then transferred to another vessel (away from excess sodium) and stirred while adding 60 ml of isopropyl bromide from a dropping funnel. After completion the NaBr is allowed to settle. The slightly yellow solution containing isopropylcyclopentadiene is then transferred to another vessel containing an excess of fresh sodium beads. The solution was heated to 40° C. and allowed to stir overnight to insure complete reaction. This solution containing sodium isopropylcyclopentadienide was transferred into another flask onto 50 g of anhydrous lanthanum chloride and allowed to stir at 60° C. for 3 hours. The excess $LaCl_3$ and NaCl were allowed to settle. The solution containing tris(isopropylcyclopentadienyl) lanthanum was transferred to another flask and solvent was removed by vacuum at or below room temperature. The product was removed by vacuum distillation at $10^{-2}$ torr in the temperature range of 180° C. to 195° C. as a viscous slightly yellow liquid. A yield of approximately 30 g was obtained. The compound was verified by using IR spectroscopy. The vapor pressure was about 0.7 torr at 75° C.

PREPARATION B

Tris(isopropylcyclopentadienyl)praseodymium:

The title compound was prepared as in Preparation A, except that 10 g of anhydrous praseodymium chloride was used in place of 50 g of lanthanum trichloride, and quantities of other reactants were one-fifth those used in Preparation A. Two grams (2 g) of viscous light green liquid tris(isopropylcyclopentadienyl)-praseodymium was obtained.

PREPARATION C

Tris(isopropylcylopentadienyl)gadolinium:

The title compound was prepared as in Preparation A except that 10 g of anhydrous gadolinium chloride was used instead of lanthanum trichloride, and quantities of other reactants were one-fifth those used in Preparation A. The liquid product, light yellow in color and less viscous than the lanthanum analog obtained in Preparation A was distilled at 200° C. and $10^{-2}$ torr.

The procedures of Preparation A, B and C may be used to prepare other precursors of formula (I) by substitution of other Group IIIB metal chlorides and/or other alkyl halides for the metal chlorides and isopropyl bromide illustrated in the Preparations.

This invention will now be further described with reference to the examples which follow.

EXAMPLE 1

Deposition of La Film by CVD

A gas-tight reactor having inlet and outlet ports and a quartz plate substrate mounted on a susceptor therein, is purged with a flowing stream of argon gas. The reactor is depressured to a pressure of 5 torr, and the substrate is heated by electrical resistance heating to a temperature of 550° C. A stream of purified argon carrier gas is bubbled through a pool of tris(isopropylcyclopentadienyl)lanthanum, which is at a temperature of 140° C. The carrier gas flow rate is 500 sccm. The resulting gas stream is continuously flowed into the reactor through a heated line while the substrate temperature is maintained at 550° C. Carrier gas with some unreacted precursor therein is continuously withdrawn through the outlet port of the reactor. Gas flow is continued for one hour. A lanthanum film about one micron thick is deposited. The reactor is then again purged with argon, repressured to atmospheric pressure with argon and then allowed to cool. The substrate with the lanthanum film deposited thereon is removed from the reactor.

Other carrier gases, such as hydrogen, can be used in place of argon if desired. A small amount (about 1% by weight) of lanthanum carbide was observed in the lanthanum film deposited in Example 1. Use of hydrogen as the carrier gas would be expected to eliminate carbon incorporation.

EXAMPLE 2

The procedure of Example 1 is repeated except that equivalent amounts of tris(isopropylcyclopentadienyl)-praseodymium, and tris(isopropylcyclopentadienyl)-gadolinium, are substituted in turn for tris(isopropylcyclopentadienyl)lanthanum. Films of praseodymium, respectively, are formed on the surface of the substrate.

Films of other Group IIIB metals, such as yttrium, may be deposited by the procedure of Example 1.

EXAMPLE 3

This example describes deposition of a lanthanum telluride film on a glass substrate. The procedure of Example 1 is followed except that separate streams of tris(isopropylcyclopentadienyl)lanthanum and diethyltelluride, both in argon as the carrier gas are flowed into the reactor at flow rates of 500 sccm and 100 sccm, respectively. Concentrations are such as to give a mole fraction of about $1.5 \times 1.^{-3}$ of each reactant. Flow of precursors in carrier gas streams in continued for one hour. A film of lanthanum telluride (LaTe) one micron thick, was deposited up during this time. After the flow of precursors has been stopped, the reactor is purged and repressured with argon, cooled and the coated substrate removed as in Example 1. The resulting lanthanum telluride film exhibits metallic properties as shown by standard tests.

Other films of intermetallic compounds, such as lanthanum phosphide, lanthanum arsenide, lanthanum antimonide, yttrium phosphide, yttrium arsenide and yttrium antimonide, can be deposited according to the procedure of Example 3 using appropriate precursors. The preferred Group IIIB metal precursors are the tris(isopropylcyclopentadienyl) compounds of the desired metals. Preferred precursors for nonmetallic elements are as follows: phosphorous, triethylphosphine, arsenic, trimethylarsenic, antimony, and trimethylantimony.

EXAMPLE 4

This example described deposition of a thin film of yttrium sesquioxide on a glass substrate. The procedure of Example 1 is followed, except that separate streams of tris(isopropylcyclopentadienyl)yttrium in carrier gas (argon), and carbon dioxide/hydrogen mixture are introduced into the reactor and directed towards the substrate. Mole fractions of yttrium precursor and carbon dioxide in the reactor are about $7.5 \times 10^{-4}$ and $10^{-2}$ respectively. A film of yttrium sesquioxide, having a thickness of about 2 microns, is deposited. The reactor is purged and the coated substrate removed as described in Example 1.

What is claimed is:

1. A process for depositing a metallic coating on a heated substrate by chemical vapor decomposition of an organometallic compound, said process comprising contacting an organometallic compound of the formula (I)

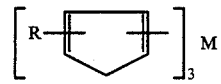

where M is a Group IIIB metal or a mixture thereof and R is an alkyl or alkenyl radical containing from 2 to about 6 carbon atoms, with said heated substrate, said substrate being at a temperature above the decomposition temperature of said organometallic compound.

2. A process according to claim 1 in which M is lanthanum or yttrium.

3. A process according to claim 1 in which R contains from 2 to about 4 carbon atoms.

4. A process according to claim 1 in which R is an alkyl radical.

5. A process according to claim 1 in which R is isopropyl.

6. A process according to claim 1 in which said organometallic compound is supplied in a stream of carrier gas.

7. A process according to claim 6 in which said carrier gas is a non-oxidizing carrier gas and said substrate is in a non-oxidizing atmosphere.

8. A process according to claim 1 in which the temperature of said substrate is from about 150 to about 1000° C.

9. A process in which said coating has a thickness not greater than about 100 microns.

10. A process according to claim 1 which further comprises contacting said substrate with an oxidizing agent, and where the metallic coating of said process comprises a metal compound.

11. A process according to claim 1 in which said metallic coating comprises at least two metals or metal compounds.

12. A process according to claim 1 in which said coating comprises an intermetallic compound.

13. A process according to claim 12 in which said intermetallic compound is lanthanum telluride.

14. A process according to claim 11 further comprising contacting said substrate with an oxidizing agent.

* * * * *